United States Patent [19]

Bailey

[11] Patent Number: 5,872,953
[45] Date of Patent: *Feb. 16, 1999

[54] SIMULATING CIRCUIT DESIGN ON A CIRCUIT EMULATION SYSTEM

[75] Inventor: Brian Bailey, Oregon City, Oreg.

[73] Assignee: Mentor Graphics Corporation, Wilsonville, Oreg.

[*] Notice: This patent issued on a continued prosecution application filed under 37 CFR 1.53(d), and is subject to the twenty year patent term provisions of 35 U.S.C. 154(a)(2).

[21] Appl. No.: 520,899

[22] Filed: Aug. 30, 1995

[51] Int. Cl.$^6$ .................................................. G06F 19/00
[52] U.S. Cl. ............................ 395/500; 364/490; 364/578
[58] Field of Search .................................. 364/488, 489, 364/490, 491, 578; 395/500

[56] References Cited

U.S. PATENT DOCUMENTS

5,448,496  9/1995  Butts et al. ............................... 364/489

OTHER PUBLICATIONS

"Satisfaction of Input and Output Encoding Constrainte" Salduuha et al., IEEE Trans. on Computer Aided Design . . . pp. 589–602, May 1994.

A. Jain et al., "Mapping Switch–Level Simulation Onto Gate–Level Hardware Accelerators", 28th ACN/IEEE Design Automation Conference, 1991.

E. W. Thompson, et al., "Digital Logic Simulation In A Time–Based, Table–Driven Environment", Part 2. Parallel Fault Simulation, Computer, vol. 8 No. 3, Mar. 1975.

R. Wieler, Z. Zhang, R. D. McLeod, *Simulating Static and Dynamic Faults in BIST Structures with a FPGA Based Emulator*, Proc. of the 4th International Workshop on Field–Programmable Logic and Applications, FPL94, Springer–Verlag, pp. 240–249.

R. Wieler, Z. Zhang, R. D. McLeod, *Emulating Static Faults Using a Xilinx Based Emulator*, 0–8186–7086–X/95, 1995 IEEE, pp. 110–115.

*Primary Examiner*—Kevin J. Teska
*Assistant Examiner*—A. S. Roberts
*Attorney, Agent, or Firm*—Blakely Sokoloff Taylor & Zafman, LLP

[57] ABSTRACT

A circuit transformation software module incorporating the teachings of the present invention is provided to an otherwise conventional emulation system. The circuit transformation software module takes a circuit design as input and transforms it into a "new" circuit design in accordance to a plurality of circuit primitive transformation rules of the present invention, which embodies a circuit state encoding scheme of the present invention. This "new" circuit design when "realized" on the otherwise conventional emulation system in a conventional manner, allows the original circuit design to be simulated on the emulation system, i.e., the response of the original circuit design under various unknown and uncertain conditions can be simulated. As a result, correctness of the original circuit design's responses under these conditions can be correctly ascertained. Additionally, reliability/accuracy of fault simulation results is improved. Furthermore, the present invention may be practiced in conjunction with physical and/or "emulating" emulation systems.

35 Claims, 19 Drawing Sheets

| Primitive | "Design" | Transformation Rules 50a |
|---|---|---|
| AND / NAND | D1 | OR |
| OR / NAND | D1 | AND |
| NAND | D0 | AND & Swap Output Connections, i.e. D0 ⨯ D1 |
| NOR | D0 | OR & Swap Ouput Connections, i.e. D0 ⨯ D1 |
| Inverter | D0, D1 | Remove & Swap Output Connections, i.e. ⨯ |
| Storage Cell | D1 | Preset ⟷ Clear |
| Tri-State Buffer | D0, D1 | AND, E of D0 Displace E of D1, E of D1 "in-between" |
| Bus | D0 + D1 | { OR + AND + OR } |

Figure 4a

| Primitive | Transformation Rules 50a |
|---|---|
| AND | { AND, OR } |
| OR | { OR, AND } |
| NAND | { AND, OR } & Swap Output Connections |
| NOR | { OR, AND } & Swap Ouput Connections |
| Inverter | { [Null], [Null] } & Swap Output Connections |
| Storage Cell | { SC1, SC2 } & for SC2, Preset ⟷ Clear |
| Tri-State Buffer | {AND, AND} , E of 1$\underline{st}$ AND displace E of 2$\underline{nd}$ AND, E of 2$\underline{nd}$ AND output "in-between" |
| Bus | { OR, AND, OR } |

Figure 4b

| Logic Value | Mapped 2-bit Representation |
|---|---|
| 0 | 01 |
| 1 | 10 |
| X | 11 |

Figure 5a

| Logic Value | Mapped 3-bit Representation |
|---|---|
| 0 | 001 |
| Z | 010 |
| 0 Z | 011 |
| 1 | 100 |
| X | 101 |
| 1 Z | 110 |
| X | 111 |

Figure 5b

| A | B | O | A' | B' | O' |
|---|---|---|----|----|----|
| 0 | 0 | 0 | 01 | 01 | 01 |
| 0 | 1 | 0 | 01 | 10 | 01 |
| 0 | X | 0 | 01 | 11 | 01 |
| 1 | 0 | 0 | 10 | 01 | 01 |
| 1 | 1 | 1 | 10 | 10 | 10 |
| 1 | X | X | 10 | 11 | 11 |
| X | 0 | 0 | 11 | 01 | 01 |
| X | 1 | X | 11 | 10 | 11 |
| X | X | X | 11 | 11 | 11 |

Figure 7a

| A | B | O | A' | B' | O' |
|---|---|---|----|----|----|
| 0 | 0 | 0 | 01 | 01 | 01 |
| 0 | 1 | 1 | 01 | 10 | 10 |
| 0 | X | X | 01 | 11 | 11 |
| 1 | 0 | 1 | 10 | 01 | 10 |
| 1 | 1 | 1 | 10 | 10 | 10 |
| 1 | X | 1 | 10 | 11 | 10 |
| X | 0 | X | 11 | 01 | 11 |
| X | 1 | 1 | 11 | 10 | 10 |
| X | X | X | 11 | 11 | 11 |

Figure 7b

| A | O | A' | O' |
|---|---|---|---|
| 0 | 1 | 01 | 10 |
| 1 | 0 | 10 | 01 |
| X | X | 11 | 11 |

Figure 7c

| D | E | O | D' | E' | O' |
|---|---|---|----|----|-----|
| 0 | 0 | Z | 01 | 01 | 010 |
| 0 | 1 | 0 | 01 | 10 | 001 |
| 0 | X | 0Z | 01 | 11 | 011 |
| 1 | 0 | Z | 10 | 01 | 010 |
| 1 | 1 | 1 | 10 | 10 | 100 |
| 1 | X | 1Z | 10 | 11 | 110 |
| X | 0 | Z | 11 | 01 | 010 |
| X | 1 | X | 11 | 10 | 101 |
| X | X | X | 11 | 11 | 111 |

Figure 10a

| D | E | O | D' | E' | O' |
|---|---|---|----|----|-----|
| 0 | 0 | Z | 01 | 01 | 010 |
| 0 | 1 | 1 | 01 | 10 | 100 |
| 0 | X | 1Z | 01 | 11 | 110 |
| 1 | 0 | Z | 10 | 01 | 010 |
| 1 | 1 | 0 | 10 | 10 | 001 |
| 1 | X | 0Z | 10 | 11 | 011 |
| X | 0 | Z | 11 | 01 | 010 |
| X | 1 | X | 11 | 10 | 101 |
| X | X | X | 11 | 11 | 111 |

Figure 10b

| $O''_3$ \ $O''_1$ | | 0 | Z | 0Z | 1 | X | 1Z | X |
|---|---|---|---|---|---|---|---|---|
| $O''_2$ | | 001 | 010 | 011 | 100 | 101 | 110 | 111 |
| 0 | 001 | 001 (0) | 001 (0) | 001 (0) | 101 (X) | 101 (X) | 101 (X) | 101 (X) |
| Z | 010 | 001 (0) | 010 (Z) | 011 (0Z) | 100 (1) | 101 (X) | 110 (1Z) | 111 (X) |
| 0Z | 011 | 001 (0) | 011 (0Z) | 011 (0Z) | 101 (X) | 101 (X) | 111 (X) | 111 (X) |
| 1 | 100 | 101 (X) | 100 (1) | 101 (X) | 100 (1) | 101 (X) | 100 (1) | 111 (X) |
| X | 101 | 101 (X) | 101 (X) | 101 (X) | 101 (X) | 101 (X) | 101 (X) | 101 (X) |
| 1Z | 110 | 101 (X) | 110 (1Z) | 111 (X) | 100 (1) | 101 (X) | 110 (1Z) | 111 (X) |
| X | 111 | 101 (X) | 111 (X) | 111 (X) | 101 (X) | 101 (X) | 111 (X) | 111 (X) |

| O" | | O' | |
|---|---|---|---|
| 0 | 001 | 01 | 0 |
| Z | 010 | 11 | X |
| 0Z | 011 | 11 | X |
| 1 | 100 | 10 | 1 |
| X | 101 | 11 | X |
| 1Z | 110 | 11 | X |
| X | 111 | 11 | X |

5,872,953

SIMULATING CIRCUIT DESIGN ON A CIRCUIT EMULATION SYSTEM

BACKGROUND OF THE INVENTION

1. Field of the Invention

The present invention relates to the field of circuit design, in particular, to the art of circuit simulation and to the art of circuit emulation.

2. Background Information

With advances in integrated circuit technology, various tools have been developed to aid the circuit designers in designing and debugging the modern highly complex integrated circuits. In particular, various circuit emulation systems comprising reconfigurable electronic elements are available for the circuit designers to quickly "realize" their designs and emulate operation of the circuits. Additionally, various simulation systems comprising sophisticated software are also available for the circuit designers to quickly model their designs and simulate operation of the circuits.

Between the two approaches (emulation verses simulation), emulation has the relative advantages of "realizing" the circuit and is fast in operation. However, emulation has at least one relative disadvantage in that the behavior of the circuit under various unknown or uncertain conditions cannot be studied. On the other hand, while simulation allows the behavior of the circuit under these unknown or uncertain conditions to be studied, simulation has at least one relative disadvantage in that the process is much slower and more time consuming.

Thus, it is desirable to have an improved approach that has the advantages of both the conventional emulation as well as the conventional simulation approaches, but without some of their respective disadvantages. As will be described in more detail below, the present invention provides for such an improved approach that achieves these and other desired results, which will be apparent to those skilled in the art from the description to follow.

SUMMARY OF THE INVENTION

A circuit transformation software module incorporating the teachings of the present invention is provided to an otherwise conventional emulation system. The circuit transformation software module takes a complete or partial circuit design as input and transforms it into a "new" circuit design in accordance to a plurality of circuit primitive transformation rules of the present invention, which embodies a circuit state encoding scheme of the present invention. This "new" circuit design when "realized" on the otherwise conventional emulation system in a conventional manner, allows the original circuit design to be simulated on the emulation system, i.e., the response of the original circuit design under various unknown and uncertain conditions can be simulated. As a result, correctness of the original circuit design's responses under these conditions can be correctly ascertained. Furthermore, reliability/accuracy of fault simulation results is improved.

The circuit primitive transformation rules for generating the "new" circuit design include rules for transforming various circuit primitives such as gates, inverters, storage cells, and tri-state drivers. These rules also include rules for injecting additional circuit elements to handle bus resolution, and circuit state encoding conversion, to form the final transformed "new" circuit design to be "realized" on the emulation system.

The circuit state encoding scheme embodied by the circuit primitive transformation rules includes 2-bit and 3-bit encodings of various circuit states. The 2-bit encodings allow for the accounting of the unknown state, and the 3-bit encodings further allow for the accounting of the high impedance state. Inputs to the original circuit design are applied to the transformed circuit design in accordance to the encoding scheme. In like manner, the simulated outputs of the original circuit design are obtained by interpreting outputs of the transformed circuit design in accordance to the encoding scheme. A 1-bit output value of a physical or "emulating" emulation system can be automatically converted into a 2-bit or 3-bit representation and provided as input to the "simulating" emulation system. In like manner, a 2-bit or 3-bit encoded output from the "simulating" emulation system can be automatically converted back into a 1-bit value, and provided as input to the physical or "emulating" emulation system. As a result, the "simulating" emulation system may also be used in conjunction with physical and/or "emulating" emulation systems.

BRIEF DESCRIPTION OF DRAWINGS

The present invention will be described by way of exemplary embodiments, but not limitations, illustrated in the accompanying drawings in which like references denote similar elements, and in which:

FIGS. 4a–4b illustrate two embodiments of selected circuit primitive transformation rules employed in the transformation steps of FIG. 3a–3b;

FIGS. 5a–5b illustrate the circuit state encoding scheme implicitly embodied by the transformation rules;

FIGS. 6a–6c and FIGS. 7a–7c illustrate how the AND gate, the OR gate and the inverter are simulated under the present invention;

FIGS. 9a–9b and FIGS. 10a–10b illustrate how the tri-state buffers are simulated under the present invention;

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
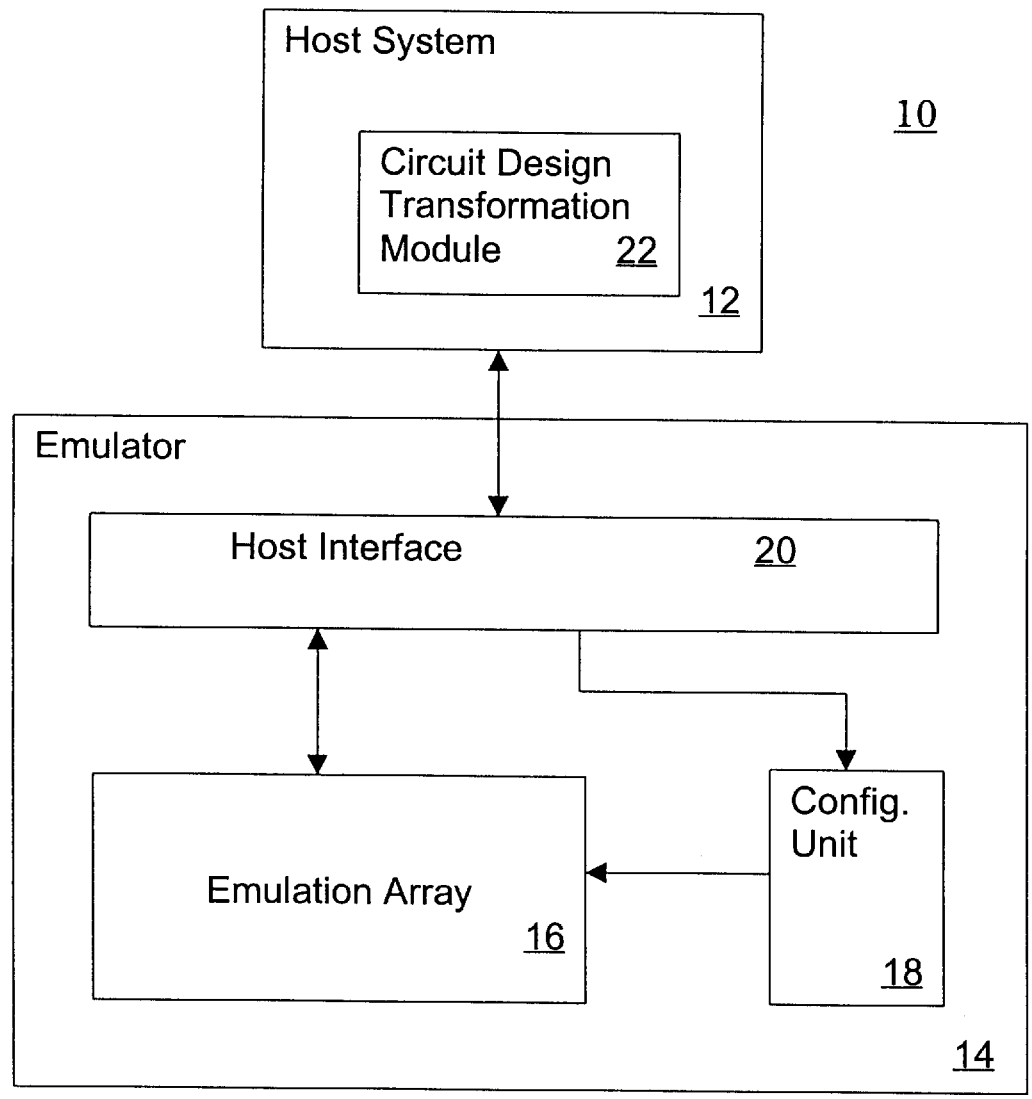
FIG. 1 illustrates an exemplary emulation system incorporated with the circuit design transformation software module of the present invention.

Referring now to FIG. 1, an emulation system 10 incorporated with the teachings of the present invention is shown. As illustrated, emulation system 10 includes host system 12 and emulator 14. Host system 12 includes in particular circuit design transformation module 22 of the present invention. In the presently preferred embodiment, circuit design transformation module 22 is implemented in software. For this embodiment, circuit design transformation module 22 is stored in a suitable storage medium (not shown) of host system 12, and loaded into memory (not shown) of host system 10 for execution by a processor (not shown) of host system 10. Except for circuit design transformation module 22, host system is intended to represent a broad category of host systems found in conventional emulation systems known in the art, thus will not be otherwise further described.

Emulator 14 includes emulation array 16, a configuration unit 18 and host interface 20 coupled to each other as shown. In other words, emulator 14 is also intended to represent a broad category of emulator know in the art, whose functions and constitutions are well known, therefore will not be further described either, except for the manner emulator 14 is used under the present invention.

Figure 2:
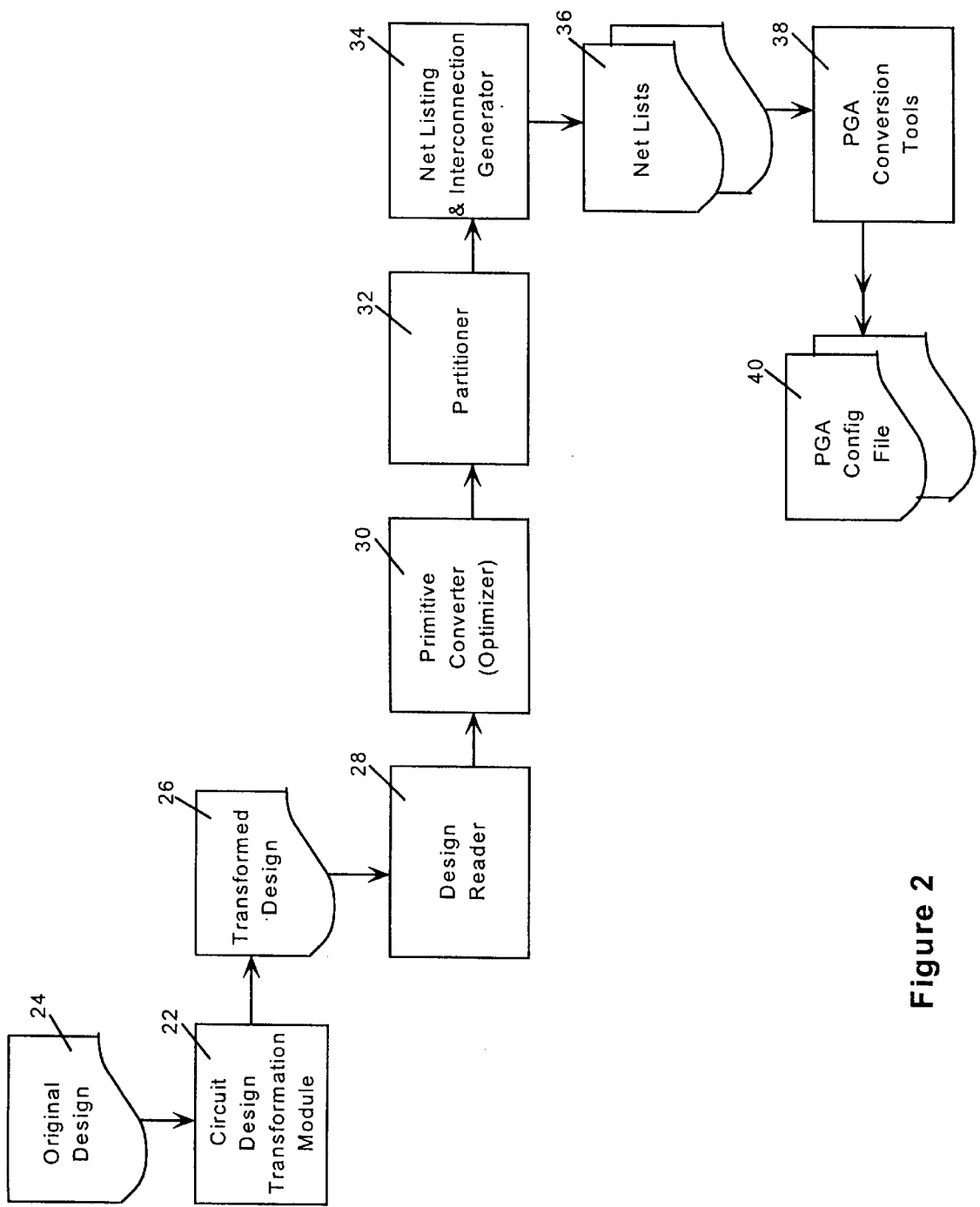
FIG. 2 illustrates the manner in which the circuit design transformation module cooperates with the other conventional elements of host system of FIG. 1.

FIG. 2 illustrates the manner in which circuit design transformation module 22 cooperates with the other conventional elements of host system 12. As shown, circuit design transformation module 22 accepts a circuit design 24 as inputs, and transforms circuit design 24 into "new" circuit design 26. Circuit design 24 may be a complete or a partial circuit design, expressed in any number of formal circuit specification language known in the art, including but not limited to the Register Transfer Level (RTL). "New" circuit design 26 is then processed by conventional elements of host system 12 such as design reader 28, primitive converter 30, partitioner 32, and netlisting and interconnection generator 34 to generate netlists 36, which in turn is processed by programmable gate array (PGA) conversion tools 38 of host system 12 to generate PGA configuration files 40. Preferably, primitive converter 30 includes an optimizer (not shown) for optimizing the transformed design 26. PGA configuration files 40 are then used to configure emulator 14 to "realize" "new" circuit design 26 on emulator 14. As will be described in more detail below, in operation, emulation of "new" circuit design 26 on emulator 14 allows the original circuit design 24 to be simulated. As will be appreciated by those skilled in the art, simulating the original circuit design 24 in this manner will require significantly less time than the conventional simulation approaches.

Figure 3A:
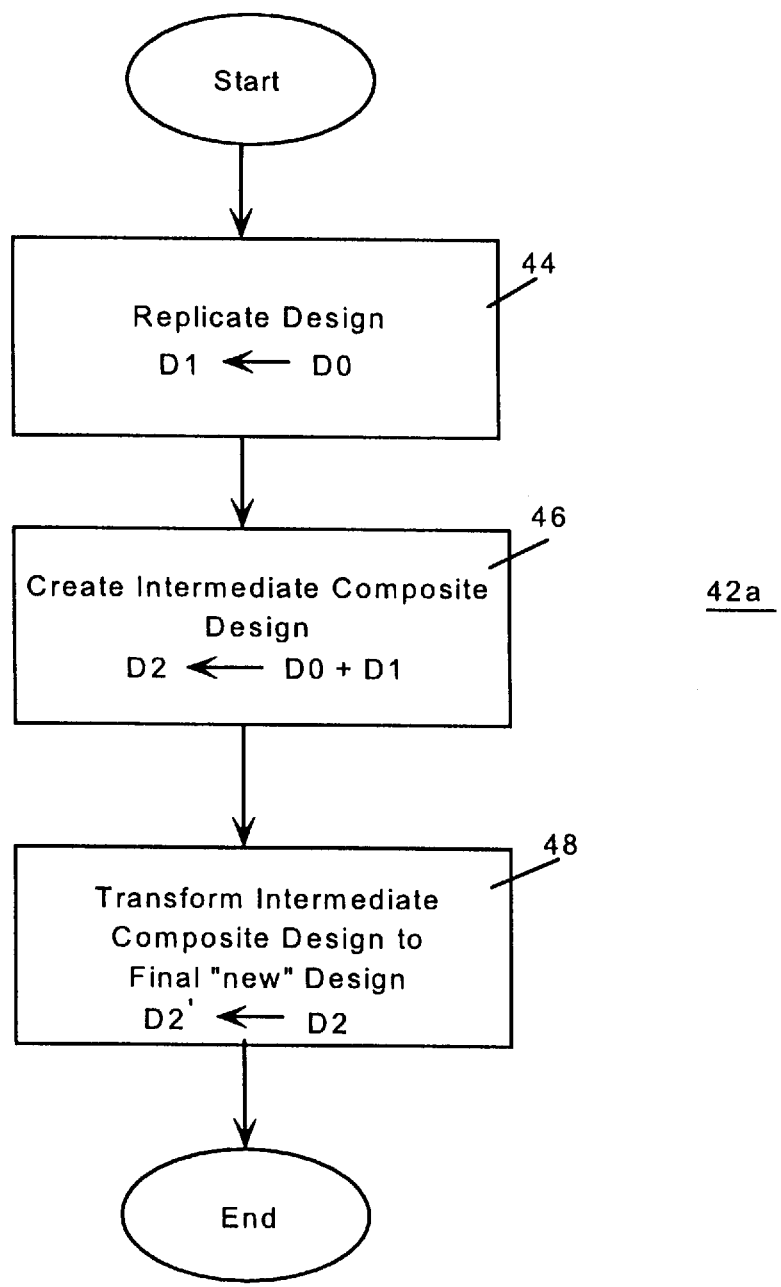
FIGS. 3a–3b illustrate two embodiments of the method steps of the circuit design transformation module.
Figure 3B:
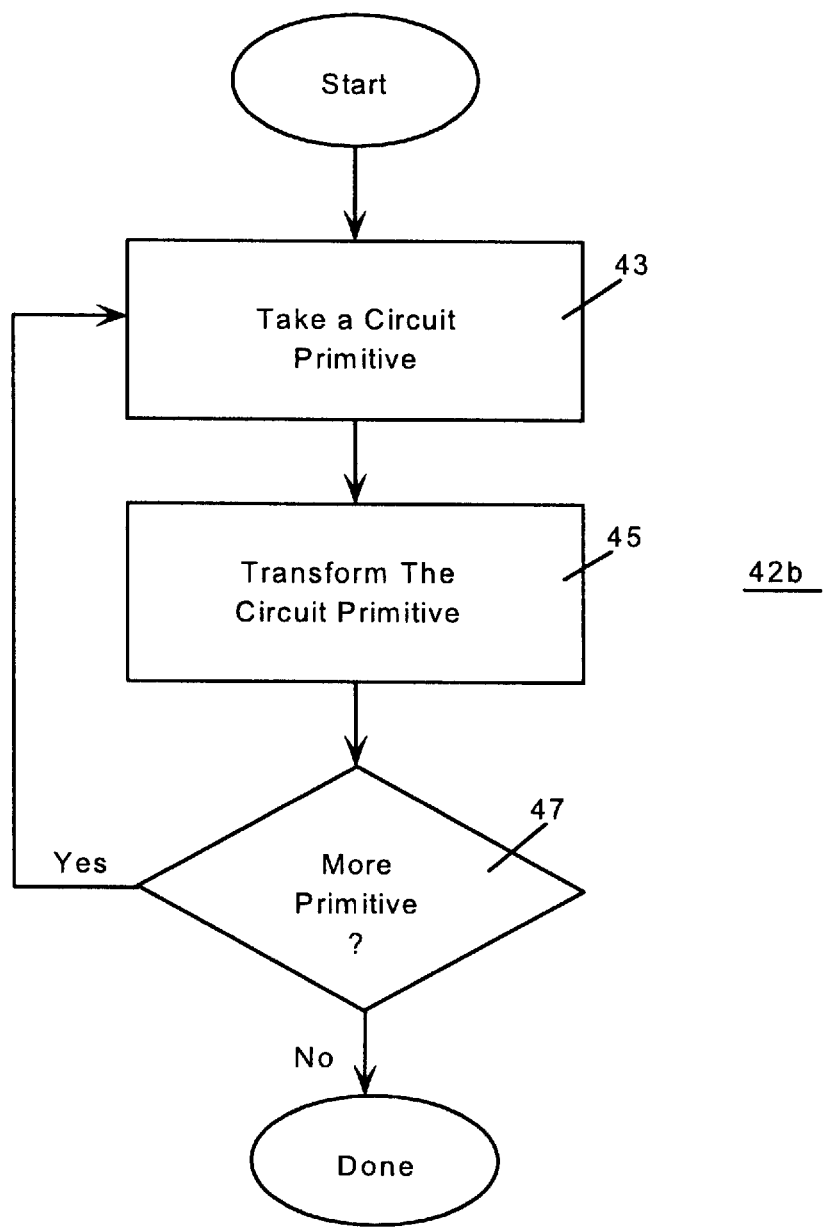

FIGS. 3a–3b illustrate two embodiments of the method steps employed by circuit design transformation module 22. Either embodiment, when used in conjunction with its corresponding embodiment of circuit primitive transformation rules (FIG. 4a or FIG. 4b), accomplishes the same end results. The embodiment illustrated in FIG. 3b is the more efficient of the two embodiments, however, the embodiment illustrated in FIG. 3a facilitates easier explanation and understanding of the principles of the present invention.

For the first illustrated embodiment, as shown in FIG. 3a, initially, step (a) 44, circuit design transformation module 22 replicates the complete or partial circuit design 24. Next, step(b) 46, circuit design transformation module 22 creates an intermediate composite circuit design (D2) comprising the original circuit design (D0) and the replicated circuit design (D1). For ease of explanation, the region constituted with D0 shall be referred to hereinafter as the primary circuit or the primary image (of the original circuit design), whereas the region constituted with D1 shall be referred to hereinafter as the secondary circuit, or the secondary image (of the original circuit design). Finally, step(c) 48, "new" circuit design (D2') 26 is generated by transforming the intermediate composite circuit (D2) in accordance to the circuit primitive transformation rules of the present invention.

For the second illustrated embodiment, as shown in FIG. 3b, circuit design transformation module 22 takes the circuit primitives, one circuit primitive at a time, step 43, and transforms the circuit primitive, step 45, in accordance to the circuit primitive transformation rules, to be more fully describe below. Circuit design transformation module 22 repeats steps 43 and 45 until all circuit primitives have been examined and transformed, step 47. As will be appreciated by those skilled in the art, in lieu of performing optimization after all circuit primitives have been transformed, for this embodiment, optimization may be performed as an integral part of the transformation process.

As will be explained in more detail below, the transformation rules of the present invention embody a circuit state encoding scheme comprising 2-bit and 3-bit encodings. Inputs to be applied to original circuit design 24 are applied to transformed circuit design 26 in accordance to the encoding scheme. In like manners, outputs of original circuit design 24 are "derived" by interpreting the outputs of transformed circuit design 26 in accordance to the encoding scheme. Both input encoding and output decoding may be accomplished by either software or physical hardware.

FIGS. 4a–4b illustrate two corresponding embodiments of the circuit primitive transformation rules of the present invention in further detail. For ease of explanation, only the fundamental circuit primitive transformation rules are illustrated. However, from the descriptions to follow, a person skilled in the art will understand the underlying principles, and be able to derive additional rules for transforming other circuit primitives.

FIG. 4a illustrates the first embodiment, which is employed by the embodiment of FIG. 3a. For this embodiment, for each AND or NAND gate in the secondary circuit (D1), the AND/NAND gate is transformed to an OR gate, and for each OR or NOR gate in the secondary circuit (D1), the OR/NOR gate is transformed to an AND gate. For each NAND gate in the primary circuit (D0), the NAND gate is transformed into an AND gate, and the output of the transformed AND gate in the primary circuit (D0) is swapped with the output of the corresponding transformed OR gate in the secondary circuit (D1), and for each NOR gate in the primary circuit (D0), the NOR gate is transformed into an OR gate, and the output of the transformed OR gate in the primary circuit (D0) is swapped with the corresponding transformed AND gate in the secondary circuit (D1).

Additionally, for each inverter, whether it is in the primary (D0) or the secondary (D1) circuit, the inverter is removed, and the corresponding uninverted "outputs" in the two circuits (D0 and D1) are swapped. For each storage cell in the secondary circuit (D1) with preset or clear connections, the asynchronous inputs to the storage cell is reversed. In other words, the asynchronous input to a storage cell in the secondary circuit (D1) is provided to clear if the asynchronous input to the storage cell's counterpart in the primary circuit (D0) is provided preset, whereas, the asynchronous input to a storage cell in the secondary circuit (D1) is provided to preset if the asynchronous input to the storage cell's counterpart in the primary circuit (D0) is provided to clear.

For each tri-state buffer, the original and replicated tri-state buffers in the primary and the secondary circuit (D0 and D1) are replaced by AND gates. The enable input to the transformed AND gate in the primary circuit (D0) is also provided to the transformed AND gate in the secondary circuit (D1), displacing the duplicated enable input in the secondary circuit (D1). The displaced enable input is rerouted to be output "in between" the transformed AND gates to form a 3-bit encoding (to be described more fully below). For an inverted tri-state buffer, the outputs of the two corresponding transformed AND gates are further swapped.

If the tri-state buffers are included in original design 24 to drive buses, for each bus, a bus resolution circuit of the present invention is inserted to handle bus resolution. Lastly, at each transition point between a 3-bit encoding region and a 2-bit encoding region of transformed design 26, a 3-bit to 2-bit encoding conversion circuit of the present invention is inserted to handle the encoding conversion between the two regions.

FIG. 4b illustrates the second embodiment, which is employed by the embodiment of FIG. 3b. For this embodiment, for each AND gate encountered, the AND gate is transformed into an ordered pair of {AND and OR} gates. For each OR gate encountered, the OR gate is transformed into an ordered pair {OR and AND} gates. For each NAND gate encountered, the NAND gate is transformed into an ordered pair of {AND and OR} gates with the outputs swapped. For each NOR gate encountered, the NOR gate is transformed into an ordered pair {OR and AND} gates with their outputs swapped. For each inverter encountered, the inverter is transformed into an ordered pair of swapped outputs. For each storage cell encountered, the storage cell is transformed into an ordered pair of first and second storage cells with the asynchronous inputs provided to the first and storage cells reversed, i.e., if the input is provided to preset of the first storage cell, then the same input is provided to clear of the second storage cell, and vice versa. For each tri-state buffer encountered, the tri-state buffer is transformed into an ordered pair of {AND and AND} gates with a first enable input applied to both AND gates and a second enable input output "in-between" the AND gates. For each bus resolution point, an ordered triplet of {OR, AND and OR} gate is inserted.

FIGS. 5a–5b illustrate the circuit state encoding scheme of the present invention in further detail. As shown, the circuit state encoding scheme includes 2-bit encodings (FIG. 5a) and 3-bit encodings (FIG. 5b). Under the 2-bit encodings, the logic value "0" is mapped to a (0,1) encoding, the logic value "1" is mapped to a (1,0) encoding, and the unknown logic value "X" (which stands for either 0 or 1) is mapped to a (1,1) encoding. Thus the 2-bit encodings allow for the accounting of the unknown state. Under the 3-bit encodings, the logic value "0" is mapped to a (0,0,1) encoding, the high impedance logic value "Z" is mapped to a (0,1,0) encoding, the logic value "0Z" (which stands for either 0 or high impedance) is mapped to a logic value (0,1,1), the logic value "1" is mapped to a (1,0,0) encoding, the logic value "1Z" (which stands for either 1 or high impedance) is mapped to a (1,1,0) encoding, and lastly, the unknown logic value "X" (which stands for either 0,1 or high impedance) is mapped to either a (1,0,1) or (1,1,1) encoding. Thus, the 3-bit encodings further allow for accounting of the high impedance state. Lastly, under both the 2-bit and 3-bit encoding, the encoding (0,0,0) denotes an undefined pre-initialization state.

In the context of the embodiment illustrated by FIG. 3a and 4a, for both 2-bit and 3-bit encodings, the most significant bit refers to the value being provided to or observed in the primary circuit (D0), whereas the least significant bit refers to the value being provided to or observed in the secondary circuit (D1). For the 3-bit encoding, the middle bit refers to an "in-between" value being provided to or observed "in-between" the primary and the secondary circuits (D0 and D1). In the context of the embodiment illustrated by FIG. 3b and 4b, for both 2-bit and 3-bit encodings, the most significant bit refers to the value being provided to or observed through the first element of an ordered pair/triplet, whereas the least significant bit refers to the value being provided to or observed through the last element of an ordered pair/triplet. For the 3-bit encoding, the middle bit refers to an "in-between" value being provided to or observed through the "middle" element of an ordered triplet.

As will be described in more detail below also, "normally" the 2-bit encoding is employed, unless the state of high impedance has to be accounted for. Under such circumstances, as discussed earlier, the 3-bit to 2-bit encoding conversion circuit is used to bridge the 3-bit encoding region and the 2-bit encoding region of transformed design 26.

Figure 6A:
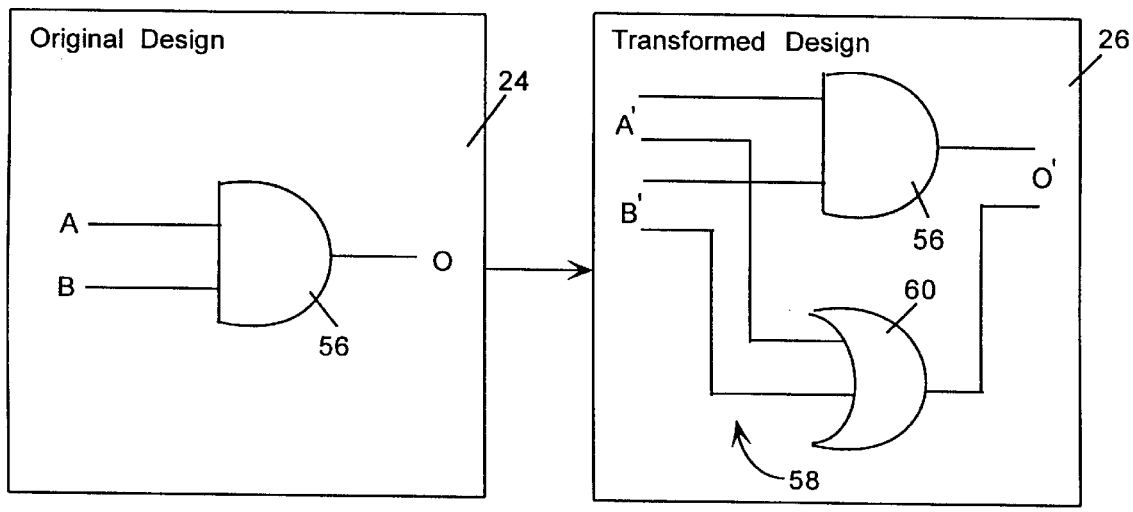
Figure 6B:
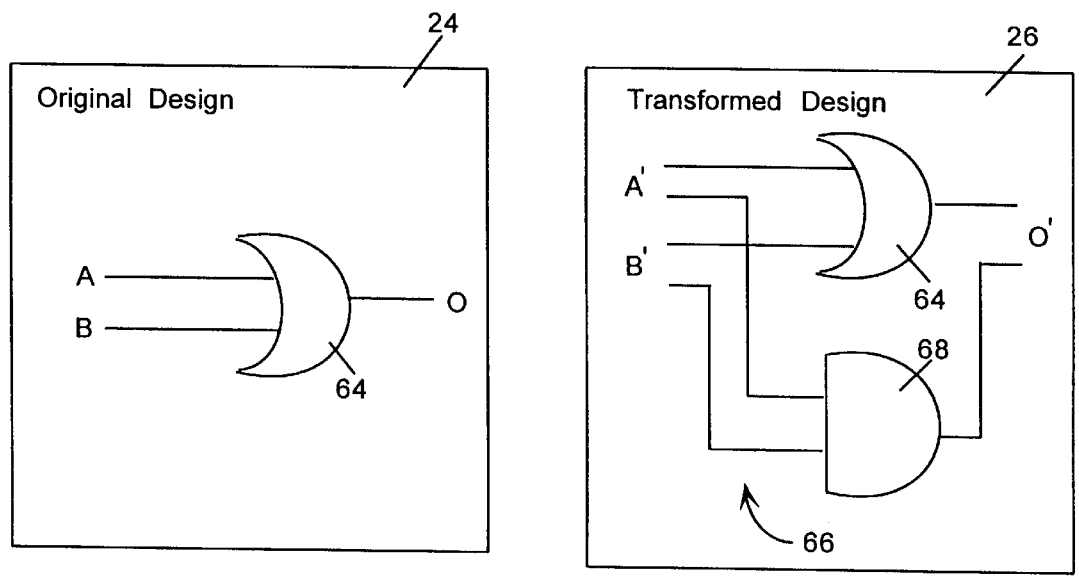
Figure 6C:
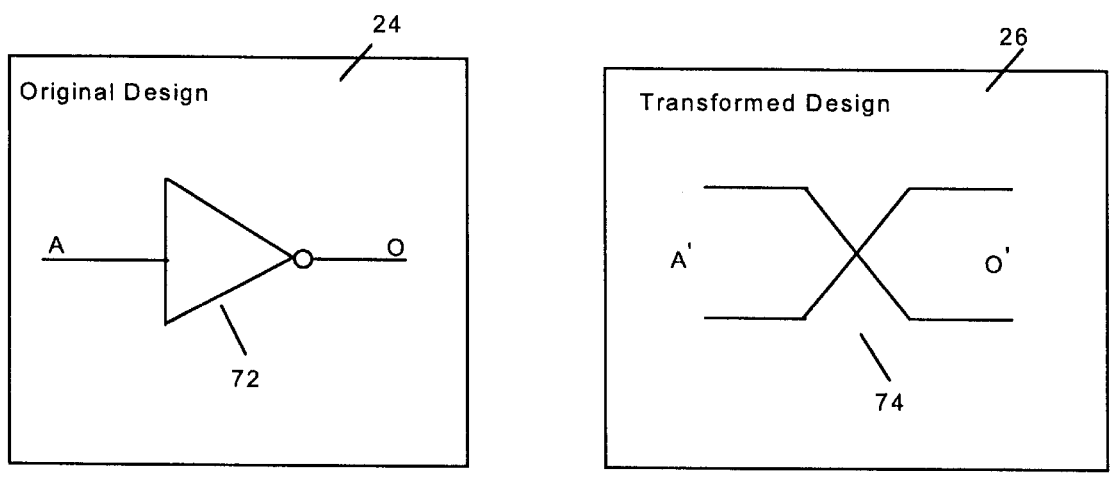
Figure 7C:
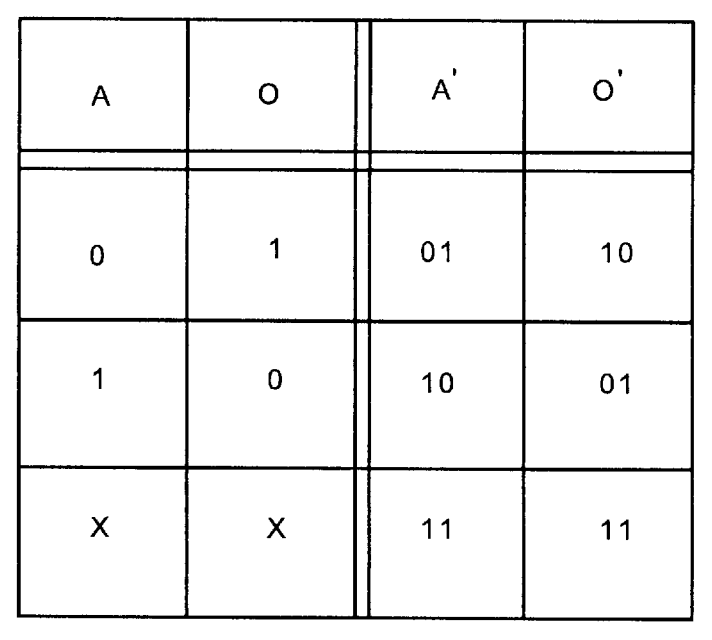

FIGS. 6a–6c illustrate how the response of an AND gate, an OR gate, and an inverter is simulated under the present invention[1]. The simulation results are summarized in FIGS. 7a–7c. As illustrated by FIG. 6a, the AND gate 56 is first replicated, and a composite design is formed using the original AND gate 56 and the replicated AND gate (not shown), as described earlier. The replicated AND gate is then replaced with an OR gate 60 in accordance to the circuit primitive transformation rules described above, resulting in transformed design 58. As summarized in FIG. 7a, the responses of AND gate 56 are correctly simulated, including the accounting of the unknown state "X", when input values are provided to transformed design 58 in accordance to the 2-bit encodings, and output values of transformed design 58 are interpreted in like manner.

[1] Since all electronic devices can be built using these three basic primitives, the underlying principles illustrated are equally applicable to all other primitives.

For example, for the case A=0 and B=1 (the correct output result is 0), the 2-bit encodings of A and B (i.e. A'=(0,1) and B'=(1,0)) are provided to transformed design 58. More specifically, the most significant bits of A' and B' (i.e. 0 and 1) are provided to AND gate 56, whereas the least significant bits of A' and B' (i.e. 1 and 0) are provided to OR gate 56. Thus, the output O' is 01, when interpreted in accordance to the 2-bit encoding, denotes the correct result "0". As a further illustration, for the case A=X and B=1 (the correct output result is X), the 2-bit encodings of A and B (i.e. A'=(1,1) and B'=(1,0)) are provided to transformed design 58. More specifically, the most significant bits of A' and B' (i.e. 1 and 1) are provided to AND gate 56, whereas the least significant bits of A' and B' (i.e. 1 and 0) are provided to OR gate 56. Thus, the output O' is 11, when interpreted in accordance to the 2-bit encoding, denotes the correct result "X".

As illustrated by FIG. 6b, the OR gate 64 is first replicated, and a composite design is formed using the original OR gate 64 and the replicated OR gate (not shown), as described earlier. The replicated OR gate is then replaced with an AND gate 68 in accordance to the circuit primitive transformation rules described above, resulting in transformed design 66. As summarized in FIG. 7b, the responses of OR gate 64 are correctly simulated, including the accounting of the unknown state "X", when input values are provided to transformed design 66 in accordance to the 2-bit encodings, and output values of transformed design 66 are interpreted in like manner.

For example, for the case A=1 and B=0 (the correct output result is 1), the 2-bit encodings of A and B (i.e. A'=(1,0) and B'=(0,1)) are provided to transformed design 66. More specifically, the most significant bits of A' and B' (i.e. 1 and 0) are provided to OR gate 64, whereas the least significant bits of A' and B', (i.e. 0 and 1) are provided to AND gate 68. Thus, the output O' is 10, when interpreted in accordance to the 2-bit encoding, denotes the correct result "1". As a further illustration, for the case A=0 and B=X (the correct output result is X), the 2-bit encodings of A and B (i.e. A'=(0,1) and B'=(1,1)) are provided to transformed design 66. More specifically, the most significant bits of A' and B' (i.e. 0 and 1) are provided to OR gate 64, whereas the least significant bits of A' and B' (i.e. 1 and 1) are provided to AND gate 68. Thus, the output O' is 11, when interpreted in accordance to the 2-bit encoding, denotes the correct result "X".

As illustrated by FIG. 6c, the inverter 72 is first replicated, and a composite design is formed using the original inverter 72 and the replicated inverter (not shown), as described earlier. The original and replicated inverters are then removed, and the "uninverted" outputs are swapped in accordance to the circuit primitive transformation rules described above, resulting in transformed design 74. As summarized in FIG. 7b, the responses of inverter 72 are correctly simulated, including the accounting of the unknown state "X", when input values are provided to transformed design 74 in accordance to the 2-bit encodings, and output values of transformed design 74 are interpreted in like manner.

For example, for the case A=1 (the correct output result is 0), the 2-bit encodings of A (i.e. A'=(1,0)) are provided to transformed design 74. More specifically, the most significant bits of A' (i.e. 1) is provided to primary circuit D0, whereas the least significant bits of A' (i.e. 0) is provided to secondary circuit D1. Thus, the output O' is 01, when interpreted in accordance to the 2-bit encoding, denotes the correct result "1". As a further illustration, for the case B=X (the correct output result is X), the 2-bit encodings of B (i.e. B'=(1,1)) are provided to transformed design 66. More specifically, the most significant bits of B' (i.e. 1) is provided to the primary circuit D0, whereas the least significant bits of B' (i.e. 1) is provided to secondary circuit D1. Thus, the output O' is 11, when interpreted in accordance to the 2-bit encoding, denotes the correct result "X".

Figure 8:
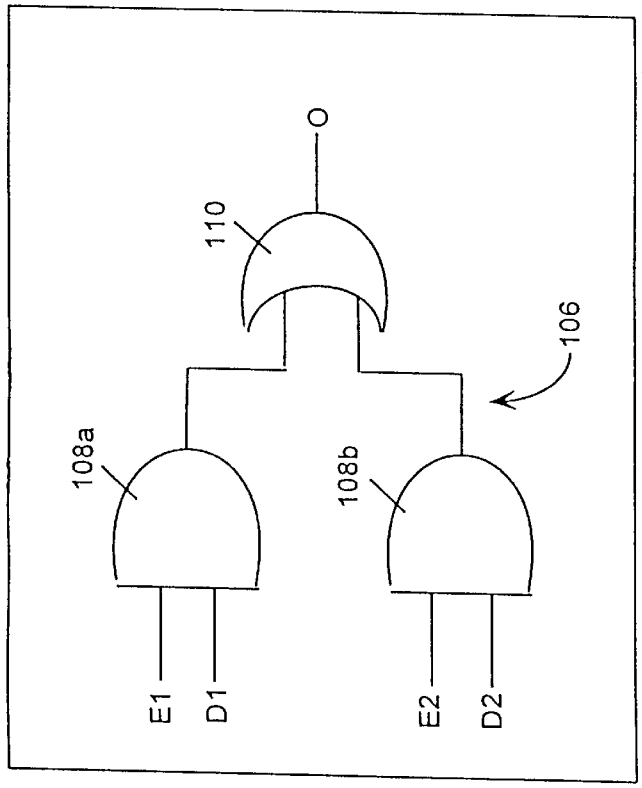
FIG. 8 illustrate modeling of tri-state buffers and bus resolution under the prior art.
Figure 8:
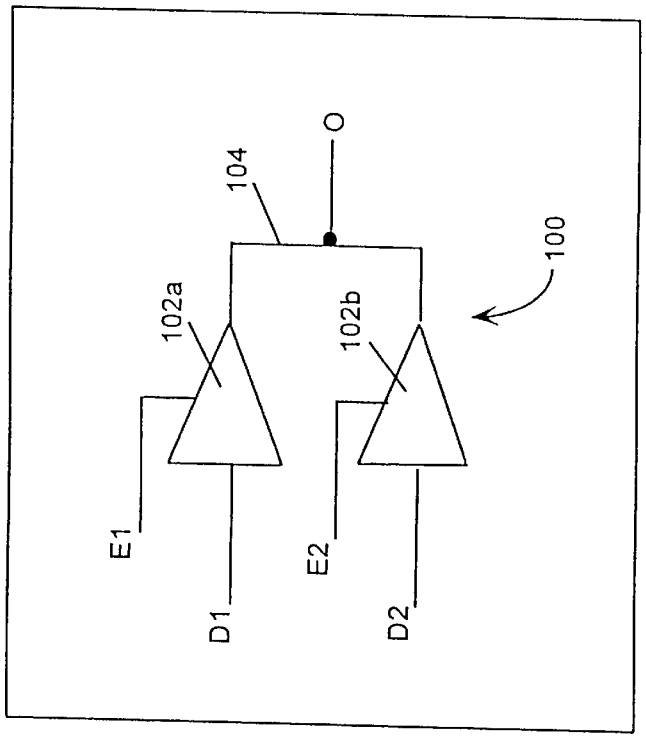

Next, we will describe how the response of a tri-state driver is simulated, including how bus resolution is simulated. Tri-state drivers are commonly found in microprocessor designs to drive buses. Before we proceed to describe in detail, we refer first briefly to FIG. 8, wherein the modeling of two tri-state drivers driving a bus is illustrated. As shown, the operating characteristic of such a circuit 100 is commonly modeled with circuit 106 comprising two AND gates 108a–108b and an OR gate 110. The enable and data inputs (E's and D's) of tri-state buffers 102a–102b are applied to the AND gates 108a–108b. The output of the AND gates 108a–108b are in turn coupled to OR gate 110, with the output of OR gate 110 denoting the state of bus 104. As appreciated by those skilled in the art, the above approach to modeling tri-state drivers and bus resolution provides the incorrect output of 0, when both enable inputs are 0. However, under the present invention, the correct output, which is high impedance, is properly simulated.

Figure 9A:
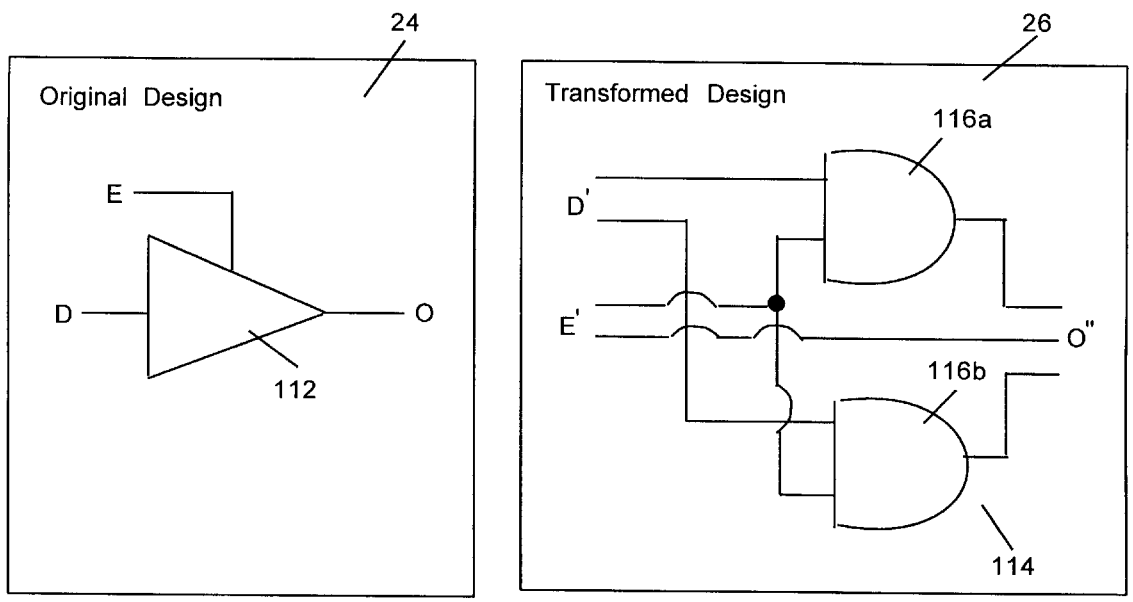
Figure 9B:
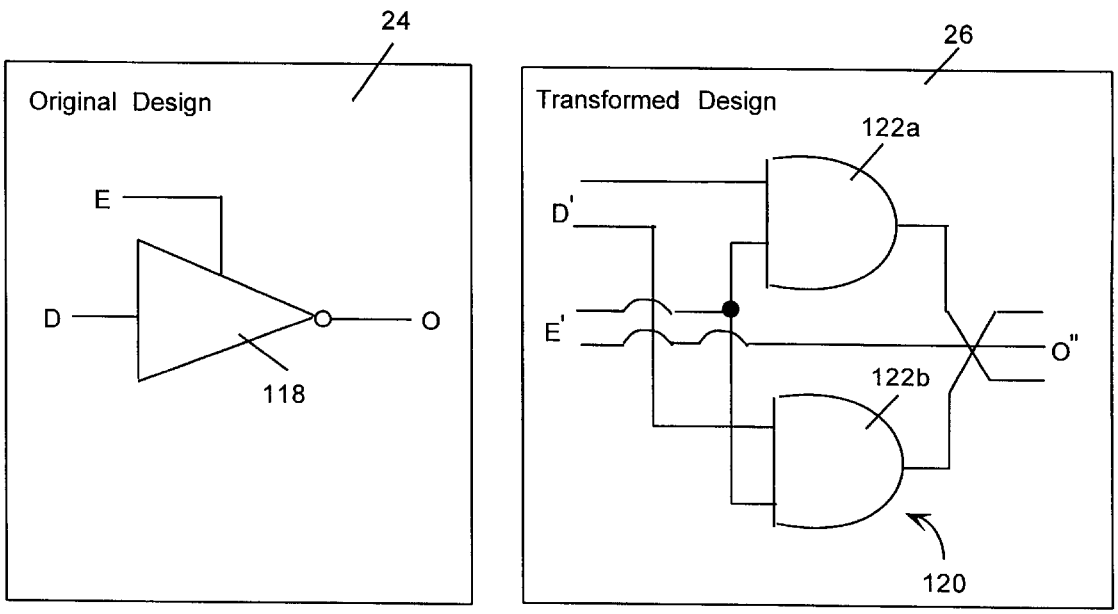

FIGS. 9a–9b illustrate how the response of a tri-state buffer is simulated under the present invention. The simulation results are summarized in FIGS. 10a–10b. As illustrated by FIG. 9a, the tri-state buffer 112 is first replicated, and a composite design is formed using the original tri-state buffer 112 and the replicated tri-state buffer (not shown), as described earlier. Both tri-state buffers are then replaced by AND gates 116a and 116b in accordance to the circuit primitive transformation rules described above. Additionally, the enable input provided to AND gate 116a in the primary circuit D0 is also provided to AND gate 116b in the secondary circuit D1 displacing the "existing" enable input. The displaced enable input is rerouted to be output "in between" the primary and secondary circuits D0 and D1 instead, resulting in transformed design 114. As summarized in FIG. 10a, the responses of tri-state buffer 112 are correctly simulated, including the accounting of the "high impedance state" (Z), the "0 or high impedance state" (0Z), the "1 or high impedance state" (1Z), and the "unknown state" (X), when input values are provided to transformed design 114 in accordance to the 2-bit encodings, and output values of transformed design 114 are interpreted in accordance to the 3-bit encodings.

For example, for the case D=0 and E=1 (the correct output result is 0), the 2-bit encodings of D and E (i.e. D'=(0,1) and E'=(1,0)) are provided to transformed design 114. More specifically, the most significant bits of D' and E' (i.e. 0 and 1) are provided to AND gate 116a, with the least significant bit of D' and the most significant bit of E' (i.e. 1 and 1) being provided to AND gate 116b, and the least significant bit of E' (i.e. 0) being output "in between". Thus, the output 0" is 001, when interpreted in accordance to the 3-bit encoding, denotes the correct result "0". As a further illustration, for the case D=1, and E=X (the correct output result is 1Z), the 2-bit encodings of D and E (i.e. D'=(1,0) and E'=(1,1)) are provided to transformed design 114. More specifically, the most significant bits of D' and E' (i.e. 1 and 1) are provided to AND gate 116a, with the least significant bit of D' and the most significant bit of E' (i.e. 0 and 1) being provided to AND gate 116b, and the least significant bit of E' (i.e. 1) being output "in between". Thus, the output 0" is 110, when interpreted in accordance to the 3-bit encoding, denotes the correct result "1Z". As yet another illustration, for the case D=X and E=1 (the correct output result is X), the 2-bit encodings of D and E (i.e. D'=(1,1) and E'=(1,0)) are provided to transformed design 114. More specifically, the most significant bits of D' and E' (i.e. 1 and 1) are provided to AND gate 116a, with the least significant bit of D' and the most significant bit of E' (i.e. 1 and 1) being provided to AND gate 116b, and the least significant bit of E' (i.e. 0) being output "in between". Thus, the output 0" is 101, when interpreted in accordance to the 3-bit encoding, denotes the correct result As illustrated by FIG. 9b, the inverted tri-state buffer 118 is first replicated, and a composite design is formed using the original inverted tri-state buffer and the replicated inverted tri-state buffer (not shown), as described earlier. Both original and replicated inverted tri-state buffers are then replaced with AND gates 122a and 122b in accordance to the circuit primitive transformation rules described above. Additionally, the enable input provided to AND gate 122a in the primary circuit D0 is also provided to AND gate 122b in the secondary circuit D1 displacing the "existing" enable input. The displaced enable input is rerouted to be output "in between" the primary and secondary circuits D0 and D1 instead. Lastly, the outputs of AND gates 122a and 122b are swapped, resulting in transformed design 120. As summarized in FIG. 10b, the responses of inverted tri-state buffer 118 are correctly simulated, including the accounting of the "high impedance state" (Z), the "0 or high impedance state" (0Z), the "1 or high impedance state" (1Z), and the unknown state (X), when input values are provided to transformed design 120 in accordance to the 2-bit encodings, and output values of transformed design 120 are interpreted in accordance to the 3-bit encodings.

Figures 11, 12:
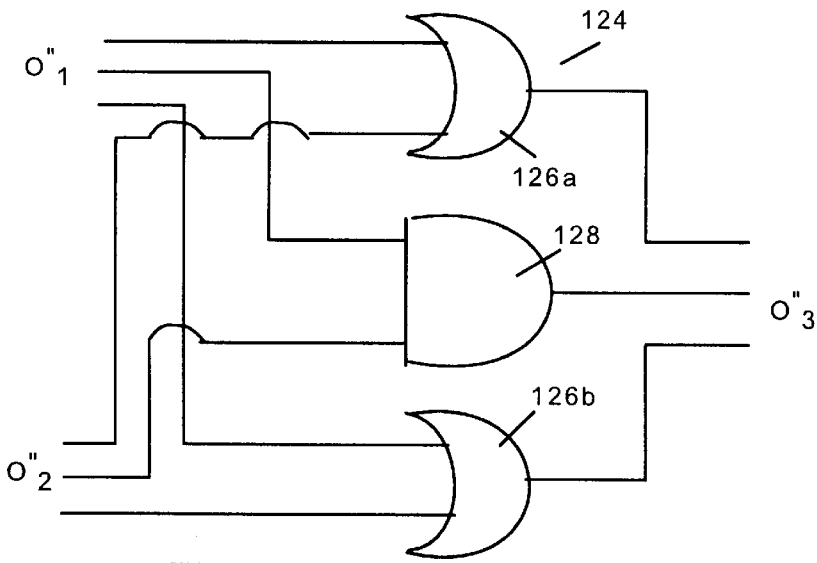
FIGS. 11–12 illustrate how bus resolution is simulated under the present invention.

For example, for the case D=1 and E=1 (the correct output result is 0), the 2-bit encodings of D and E (i.e. D'=(1,0) and E'=(0,1)) are provided to transformed design 120. More specifically, the most significant bits of D' and E' (i.e. 1 and 1) are provided to AND gate 122a, with the least significant bit of D' and the most significant bit of E' (i.e. 0 and 1) being provided to AND gate 122b, and the least significant bit of E' (i.e. 0) being output "in between". Thus, the output 0" is 001, when interpreted in accordance to the 3-bit encoding, denotes the correct result FIG. 11 illustrates the circuit employed to perform bus resolution under the present invention. The results of bus resolution are summarized in FIG. 12. While for ease of explanation, bus resolution circuit 124 is illustrated with outputs from two tri-state drivers, however, it will be appreciated by those skilled in the art that the same principle may be employed to resolve the outputs any number of tri-state drivers.

As shown in FIG. 11, bus resolution circuit 124 comprises OR gates 126a–126b and AND gate 128. OR gate 126a is disposed in the primary circuit D0 and is used to resolve the most significant bits of the 3-bit encodings, whereas OR gate 126b is disposed in the secondary circuit D1 and is used to resolve the least significant bits of the 3-bit encodings. AND gate 128 is disposed "in-between" the primary and secondary circuits, D0 and D1, and is used to resolve the middle bit of the 3-bit encodings. As a result, the "0Z", the "1Z", the "Z" as well as the "X" circuit states are all resolve correctly.

For example, if both $O_1$" and $O_2$" are in the "Z" states, i.e. having the encoding value "010", the resolved $O_3$" value is also going to be "010" denoting the "Z" state. As a further illustration, if $O_1$" is an unknown state, denoted by either "101" or "111", then regardless of the state of $O_2$", the resolved $O_3$" value is going to be "101" or "111" denoting the "X" state.

Figures 13, 14:
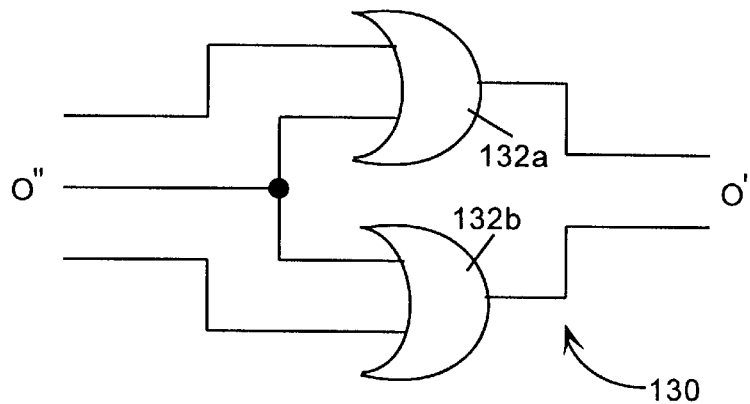
FIGS. 13–14 illustrate a 3-bit to 2-bit encoding conversion circuitry of the present invention.

FIG. 13 illustrates the 3-bit to 2-bit encoding conversion circuit of the present invention. The conversion results are summarized in FIG. 14. As shown in FIG. 13, encoding conversion circuit 130 comprises OR gates 132a–132b. OR gate 132a is used to combine the most significant and the middle bit of the 3-bit encodings, whereas OR gate 132b is used to combine the middle and the least significant bit of the 3-bit encodings. As a result, all seven states under the 3-bit encoding, including the "0Z", the "1Z", and the "Z" states, are correctly mapped back to the three states under the 2-bit encoding. As shown in FIG. 14, the 3-bit encodings "001" and "100" for states "0" and "1" are correctly converted to "01" and "10" denoting the same states, whereas all other encodings denoting the "Z", "0Z", "1Z" and the "X" states are correctly converted to "11" denoting the "X" state.

Figure 15:
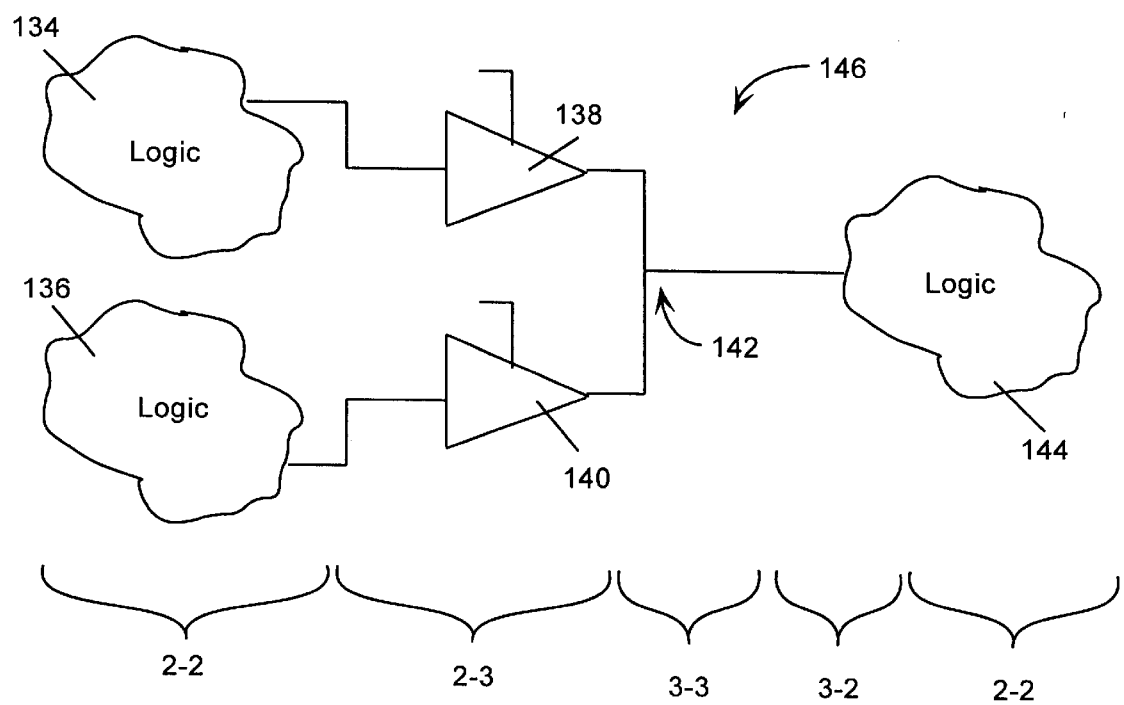
FIG. 15 illustrates an exemplary design applying the teachings of present invention.

FIG. 15 illustrates how the above described transformations and the encoding conversion circuit fit together. As shown, exemplary design 146 comprises logic sections 134, 136, and 144, tri-state buffers 138 and 140, and bus 142. Logic sections 134, 136 and 144 are constituted with 3-state elements (i.e. "0" "1" and "X"). Furthermore, logic sections 134 and 136 are connected to bus 142 through tri-state drivers 138 and 140 respectively. The "data" on bus 142 is in turn provided to logic section 144. Thus, logic sections 134, 136 and 144 when transformed in accordance to the teachings of the present invention as described earlier will be employing 2-bit encodings, whereas bus 142 when transformed in like manner will be employing 3-bit encodings. Tri-state buffers 138 and 140 when transformed in like manner will accept their inputs from logic sections 134 and 136 in 2-bit encodings, but output to the bus with 3-bit encodings. Encoding conversion circuit 130 will be inserted between bus 142 and logic section 144 to convert the "data" in bus 142 from 3-bit encoding to 2-bit encoding before the "data" are provided to logic section 144.

Figure 16:
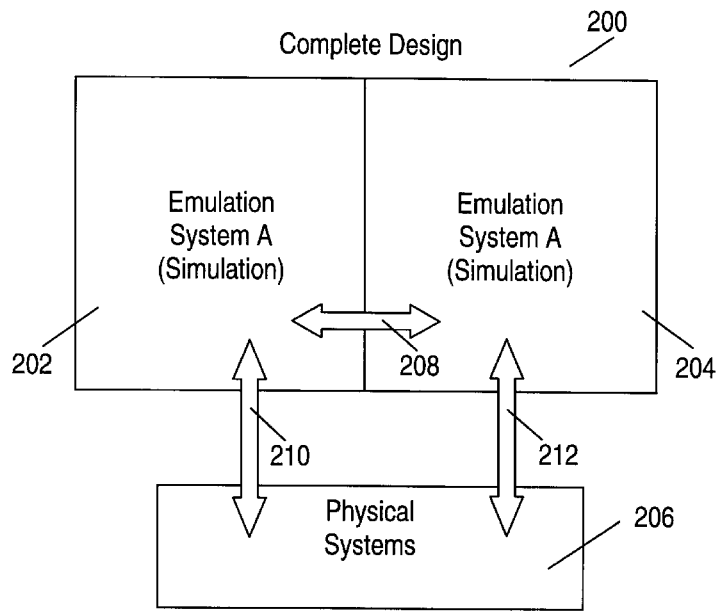
FIG. 16 illustrates utilization of the present invention in conjunction with other physical and/or "emulating" emulation systems.
Figure 17A:
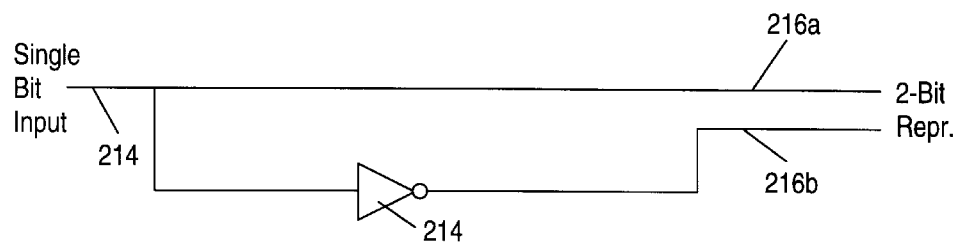
FIGS. 17a–17b illustrate automatic encoding of 1-bit values in 2-bit or 3-bit representations.
Figure 17B:
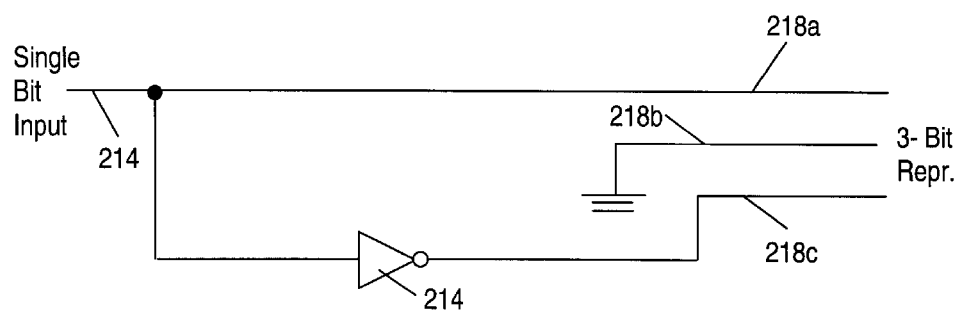

FIG. 16 illustrates an exemplary usage of the present invention in conjunction with an "emulating" emulation system and a physical system. As shown, a portion of a circuit design is simulated using a first emulation system 202 as described above, and the remainder of the circuit design is emulated on a second emulation system 204. Both emulation systems 202 and 204 are coupled to a physical system 206. Data signals are exchanged between the three systems 202–206. The manner in which data signals can be exchanged between second emulation system 204 and physical system 206 is known in the art, and will not be further described. FIGS. 17a–17b illustrate how data signals can be provided from emulation or physical system 204 or 206 to emulation system 202. FIGS. 18a–18b and 19a–19b illustrate the reverse, i.e. how data signals can be provided from emulation system 202 to emulation or physical system 204 or 206.

As shown in FIG. 17a, a 1-bit value from emulation system 204 or physical system 206 can be automatically encoded into a 2-bit representation and provided to emulation system 202, by outputting a first copy of the 1-bit value unchanged as the most significant bit of the 2-bit encoding, and a second inverted copy of the 1-bit value as the least significant bit of the 2-bit encoding. In other words, a "0" 1-bit value will be output as "01" denoting "0" as required, and a "1" 1-bit value will be output as "10" denoting "1" as required.

In like manner, FIG. 17b shows a 1-bit value from emulation system 204 or physical system 206 can be automatically encoded into a 3-bit representation and provided to emulation system 202, by outputting a first copy of the 1-bit value unchanged as the most significant bit of the 3-bit encoding, a constant "0" value as the middle bit of the 3-bit encoding, and a second inverted copy of the 1-bit value as the least significant bit of the 3-bit encoding. In other words, a "0" 1-bit value will be output as "001" denoting "0" as required, and a "1" 1-bit value will be output as "100" denoting "1" as required.

Figure 18A:
FIGS. 18a–18b and 19a–19d illustrate automatic decoding of 2-bit and 3-bit representations back to 1-bit values.
Figure 18B:
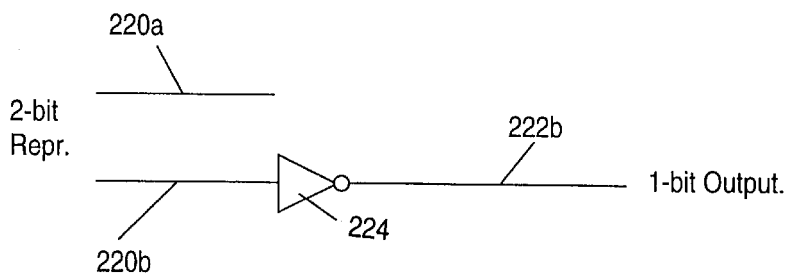
Figure 19A:
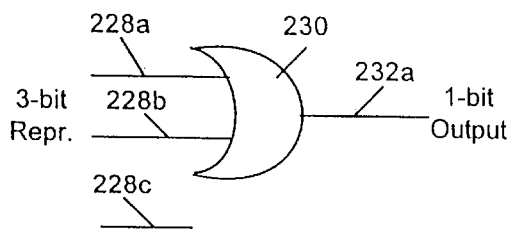
Figure 19C:
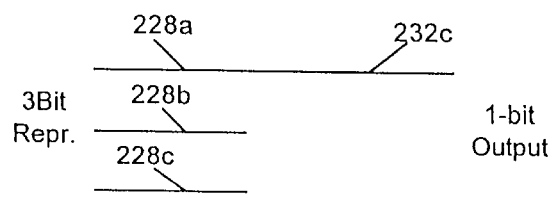
Figure 19B:
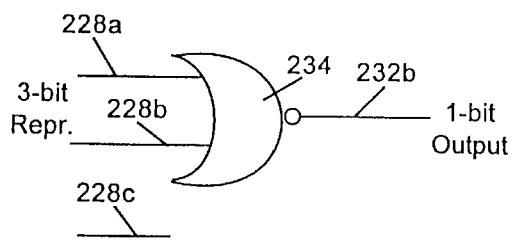
Figure 19D:
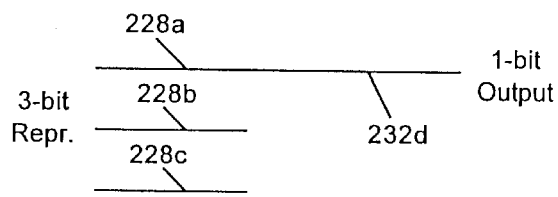

FIGS. 18a–18b illustrate two embodiments on how 2-bit encodings output by emulation system 202 can be automatically decoded as 1-bit encoding and provided to either emulation system 204 or physical system 206. For the first embodiment, FIG. 18a, the most significant bit is output, and the least significant bit is dropped, whereas for the second embodiment, FIG. 18b, the most significant bit is dropped, and an inverted copy of the least significant bit is output. In other words, for both cases, "01" denoting "0" will be correctly output as "0", and "10" denoting "1" will also be correctly output as "1". For a "11" encoding denoting the unknown state, the first embodiment outputs a "1", whereas the second embodiment outputs a "0". The choice between the two embodiments is application dependent, i.e. whether a "1" or a "0" should be assumed when the unknown state is encountered.

Similarly, FIGS. 19a–19d illustrate four embodiments on how 3-bit encodings output by emulation system 202 can be automatically decoded as 1-bit encoding and provided to either emulation system 204 or physical system 206. For the first embodiment, FIG. 19a, the logical OR of the most significant bit and the middle bit is output, and the least significant bit is dropped, whereas for the second embodiment, FIG. 19b, the most significant bit is dropped, and the logical NOR of the middle and the least significant bit is output. For the third and fourth embodiments, FIG. 19c and 19d, either the most significant bit or the least significant bit is output, with the other bits dropped. In other words, for all four cases, "001" denoting "0" will be correctly output as "0", and "100" denoting "1" will also be correctly output as "1".

For a "010" encoding denoting the "Z" state, the first embodiment outputs a "1", whereas the other three embodiments outputs a "0". For a "011" encoding denoting the "0Z" state, the first and fourth embodiment output a "1", whereas the second and third embodiments outputs a "0". For a "110" encoding denoting the "1Z" state, the first and third embodiment output a "1", whereas the second and fourth embodiments outputs a "0". For a "101" or "111" encoding denoting the unknown state, the second embodiment outputs a "0", and the other embodiments output a "1". Again, the choice among the four embodiments is application dependent, i.e. whether a "1" or a "0" should be assumed when the "Z", "0Z", "1Z" and unknown states are encountered. The four choices also represent whether an optimistic or a pessimistic approach to the various "non-definitive" state should be adopted for the particular application.

Lastly, in addition to the usage and advantages discussed above, the present invention may also be used to improve the reliability of fault simulation results. Under the present invention, a number of previously undetectable fault conditions have now become potentially detectable conditions, improving the granularity of fault simulation from merely detectable versus undetectable, to detectable, potentially detectable and undetectable. For example, consider the tri-state driver illustrated in FIG. 9a, if D has the value 0 and E has the value 1, the fault condition that the E input line is stuck to open is undetectable under the prior art, because "0" remains to be output generated. However, under the present invention, the output of the transformed design will change from "001" denoting "0" to "010" denoting "Z", more accurately suggesting that the fault is potentially detectable.

Thus, a method and apparatus for simulating circuit design on an emulation system has been described. While the method and apparatus of the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. An apparatus comprising means for transforming a first circuit design into a second circuit design in accordance to a plurality of circuit primitive based transformation rules embodying a circuit state encoding scheme for simulating the first circuit design through emulation of the second circuit design.

2. The apparatus as set forth in claim 1, wherein the circuit primitive transformation rules include one or more rules that effectively transform an AND gate having a first and a second input and a first output into an ordered pair of AND and OR gates having encoded representations of the first and second inputs as the ordered pair's inputs and the ordered pair's outputs representing the first output.

3. The apparatus as set forth in claim 1, wherein the circuit primitive transformation rules include one or more rules that effectively transform an OR gate having a first and a second input and a first output into an ordered pair of OR and AND gates having encoded representations of the first and second inputs as the ordered pair's inputs and the ordered pair's outputs representing the first output.

4. The apparatus as set forth in claim 1, wherein the circuit primitive transformation rules include one or more rules that effectively transform a NAND gate having a first and a second input and a first output into an ordered pair of AND and OR gates with swapped outputs having encoded representations of the first and second inputs as the ordered pair's inputs and the ordered pair's outputs representing the first output.

5. The apparatus as set forth in claim 1, wherein the circuit primitive transformation rules include one or more rules that effectively transform a NOR gate having a first and a second input and a first output into an ordered pair of OR and AND gates with swapped outputs having encoded representations of the first and second inputs as the ordered pair's inputs and the ordered pair's outputs representing the first output.

6. The apparatus as set forth in claim 1, wherein the circuit primitive transformation rules include one or more rules that effectively transform an inverter having a first input and a first output into an ordered pair of uninverted connections with swapped outputs having encoded representations of the first input as the ordered pair's inputs and the ordered pair's outputs representing the first output.

7. The apparatus as set forth in claim 1, wherein the circuit primitive transformation rules include one or more rules that effectively transform a storage cell having a preset input into an ordered pair of two storage cells having an ordered preset input to one of the correspondingly ordered storage cell and an ordered clear input to the other correspondingly ordered storage cell.

8. The apparatus as set forth in claim 1, wherein the circuit primitive transformation rules include one or more rules that effectively transform a storage cell having a clear input into an ordered pair of two storage cells having an ordered clear input to one of the correspondingly ordered storage cell and an ordered preset input to the other correspondingly ordered storage cell.

9. The apparatus as set forth in claim 1, wherein the circuit primitive transformation rules include one or more rules that effectively transform a tri-state driver having a data input, an enable input and a first output into an ordered pair of AND gates having an encoded representation of the data input and a first subset of an encoded representation of the enable input as the ordered pair's inputs, and the ordered pair's outputs in conjunction with a second subset of the encoded representation of the enable input representing the first output.

10. The apparatus as set forth in claim 1, wherein the circuit primitive transformation rules include one or more rules that effectively transform an inverted tri-state driver having a data input, an enable input and a first output into an ordered pair of AND gates with swapped outputs having an encoded representation of the data input and a first subset of an encoded representation of the enable input as the ordered pair's inputs, and the ordered pair's swapped outputs in conjunction with a second subset of the encoded representation of the enable input representing the first output.

11. The apparatus as set forth in claim 1, wherein the circuit primitive transformation rules include one or more rules that effectively transform a bus driven by a first and a second output of a first and a second (uninverted/inverted) tri-state driver having a bus state into an ordered structure of a first OR gate, an AND gate and a second OR gate having encoded representations of the first and second outputs as the ordered structure's inputs and the ordered structure's outputs as encoded representation of the bus state.

12. The apparatus as set forth in claim 1, wherein the transformation means transforms circuit primitives of the first circuit design, one circuit primitive at a time, until all circuit primitives of the first circuit design have been transformed, to generate the second circuit design.

13. The apparatus as set forth in claim 1, wherein the transformation means replicates the first circuit design into a third circuit design, forms a fourth circuit design with the first and third circuit designs, and then transforms the fourth circuit design to generate the second circuit design.

14. The apparatus as set forth in claim 1, wherein the circuit state encoding scheme includes 2-bit encodings and 3-bit encodings.

15. The apparatus as set forth in claim 14, wherein the 2-bit encodings include a "0,1" encoding denoting a "0" state, a "1,0" encoding denoting a "1" state, and a "1,1" encoding denoting an unknown state.

16. The apparatus as set forth in claim 14, wherein the 3-bit encodings include a "0,0,1" encoding denoting a "0" state, a "0,1,0" encoding denoting a "high impedance" state, a "011" denoting a "0 or high impedance" state, a "1,0,0" encoding denoting a "1" state, a "1,0,1" encoding denoting an "unknown" state, a "1,1,0" encoding denoting a "1 or high impedance" state, and a "1,1,1" encoding denoting also the "unknown" state.

17. The apparatus as set forth in claim 14, wherein the circuit primitive transformation rules include one or more rules that effectively cause insertion of an encoding conversion circuit between a 3-bit encoded region and the 3-bit encoded region's corresponding 2-bit encoded region.

18. The apparatus as set forth in claim 17, wherein the encoding conversion circuit comprises a first OR gate for receiving a first and a second bit of a 3-bit encoding as first inputs and generating a logical OR of the first inputs as a first bit of a 2-bit encoding, and a second OR gate for receiving the second bit and a third bit of the 3-bit encoding as second inputs and generating a logical OR of the second inputs as a second bit of the 2-bit encoding.

19. A host system of an emulation system comprising a storage medium storing a circuit design transformation program for transforming a first circuit design into a second circuit design in accordance to a plurality of circuit primitive based transformation rules embodying a circuit state encoding scheme for simulating the first circuit design through emulation of the second circuit design; and a processor coupled to the storage medium for executing the circuit design transformation program.

20. An emulation system comprising a host system including a circuit design transformation program for transforming a first circuit design into a second circuit design in accordance to a plurality of circuit primitive based transformation rules embodying a circuit state encoding scheme for simulating the first circuit design through emulation of the second circuit design; and an emulator for emulating the second circuit design.

21. A system comprising:
   a first emulation system for simulating a first circuit design by emulating a second circuit design, the second circuit design being generated by transforming the first circuit design in accordance to a plurality of circuit primitive based transformation rules embodying a circuit state encoding scheme; and
   a plurality of encoding/decoding bridging circuits coupled to the first emulation system for automatically encoding inputs to the second circuit design, and for automatically decoding outputs of the second circuit.

22. The system as set forth in claim 21, wherein the encoding/decoding bridging circuits includes an encoding bridging circuit for generating a 2-bit encoding of a 1-bit value comprising the 1-bit value and an inverted copy of the 1-bit value.

23. The system as set forth in claim 21, wherein the encoding/decoding bridging circuits includes an encoding bridging circuit for generating a 3-bit encoding of a 1-bit value comprising the 1-bit value, a constant zero, and an inverted copy of the 1-bit value.

24. The system as set forth in claim 21, wherein the encoding/decoding bridging circuits includes a decoding bridging circuit for generating a 1-bit value from a 2-bit encoding using the most significant bit of the 2-bit encoding.

25. The system as set forth in claim 21, wherein the encoding/decoding bridging circuits includes a decoding bridging circuit for generating a 1-bit value from a 2-bit encoding using an inverted copy of the least significant bit of the 2-bit encoding.

26. The system as set forth in claim 21, wherein the encoding/decoding bridging circuits includes a decoding bridging circuit for generating a 1-bit value from a 3-bit encoding using the most significant bit of the 3-bit encoding.

27. The system as set forth in claim 21, wherein the encoding/decoding bridging circuits includes a decoding bridging circuit for generating a 1-bit value from a 3-bit encoding using the least significant bit of the 3-bit encoding.

28. The system as set forth in claim 21, wherein the encoding/decoding bridging circuits includes a decoding bridging circuit for generating a 1-bit value from a 3-bit encoding by forming a logical OR of a first and a second bit of the 3-bit encoding.

29. The system as set forth in claim 21, wherein the encoding/decoding bridging circuits includes a decoding bridging circuit for generating a 1-bit value from a 3-bit encoding by forming a logical NOR of a first and a second bit of the 3-bit encoding.

30. The system as set forth in claim 21, wherein the system further comprises a second emulation system coupled to the first emulation system and the encoding/decoding bridging circuits for emulating a third circuit design at the same time, the encoding/decoding bridging circuits encode outputs of the third circuit design for the second circuit design and decode outputs of the second circuit design for the third circuit design.

31. The system as set forth in claim 21, wherein the system further comprises an operating physical device coupled to the first emulation system and the encoding/decoding bridging circuits being operated at the same time, the encoding/decoding bridging circuits encode outputs of the physical device for the second circuit design and decode outputs of the second circuit design for the physical device.

32. In an emulation system, a method for simulating a first circuit design, the method comprising the steps of:
   a) transforming a first circuit design into a second circuit design in accordance to a plurality of circuit primitive based transformation rules embodying a circuit state encoding scheme;
   b) realizing the second circuit design on the emulation system;

c) emulating the realized second circuit design, providing inputs for the first circuit design to the realized second circuit design in accordance to the circuit state encoding scheme, and determining outputs of the first circuit design by interpreting outputs of the realized second circuit design also in accordance to the circuit state encoding scheme.

33. A method for evaluating a system, the method comprising the steps of:

a) transforming a first circuit design of the system into a second circuit design in accordance to a plurality of circuit primitive based transformation rules embodying a circuit state encoding scheme;

b) realizing the second circuit design on a first emulation system;

c) emulating the realized second circuit design, providing inputs for the first circuit design to the realize d second circuit design in accordance to the circuit state encoding scheme, and determining outputs of the first circuit design by interpreting outputs of the realized second circuit design also in accordance to the circuit state encoding scheme.

34. The method as set forth in claim 33, wherein the method further comprises the steps of:

d) coupling a physical device to the first emulator system and operating the physical device concurrently with the emulation of the second circuit design on the first emulator system; and e) automatically encoding outputs of the physical device for the second circuit design and decoding outputs of the second circuit design for the physical device.

35. The method as set forth in claim 33, wherein the method further comprises the steps of:

d) coupling a second emulator system to the first emulator system and emulating a third circuit design on the second emulator system concurrently with the emulation of the second circuit design on the first emulator system; and e) automatically encoding outputs of the third circuit design for the second circuit design and decoding outputs of the second circuit design for the third circuit design.

* * * * *